(12) United States Patent
Li et al.

(10) Patent No.: US 8,947,924 B2
(45) Date of Patent: Feb. 3, 2015

(54) DATA READOUT CIRCUIT OF PHASE CHANGE MEMORY

(75) Inventors: Xi Li, Shanghai (CN); Houpeng Chen, Shanghai (CN); Zhitang Song, Shanghai (CN); Daolin Cai, Shanghai (CN)

(73) Assignee: Shanghai Institute of Microsystem and Information Technology, Chinese Academy of Sciences, Shanghai (CN)

(*) Notice: Subject to any disclaimer, the term of this patent is extended or adjusted under 35 U.S.C. 154(b) by 0 days.

(21) Appl. No.: 13/202,963

(22) PCT Filed: Jun. 24, 2011

(86) PCT No.: PCT/CN2011/076315
§ 371 (c)(1),
(2), (4) Date: Aug. 23, 2011

(87) PCT Pub. No.: WO2012/167456
PCT Pub. Date: Dec. 13, 2012

(65) Prior Publication Data
US 2014/0078820 A1    Mar. 20, 2014

(30) Foreign Application Priority Data
Jun. 7, 2011    (CN) .......................... 2011 1 0151742

(51) Int. Cl.
*G11C 13/00* (2006.01)

(52) U.S. Cl.
CPC .......... *G11C 13/004* (2013.01); *G11C 13/0004* (2013.01); *G11C 13/0026* (2013.01); *G11C 2013/0054* (2013.01)
USPC ................. 365/163; 365/189.15; 365/189.06; 365/207; 365/209; 365/208

(58) Field of Classification Search
USPC ............... 365/163, 189.15, 148, 207, 189.06, 365/209, 210, 205, 208, 171
See application file for complete search history.

(56) References Cited

U.S. PATENT DOCUMENTS

| | | | |
|---|---|---|---|
| 7,433,253 B2 * | 10/2008 | Gogl et al. .................... 365/209 |
| 2009/0285016 A1 * | 11/2009 | Bedeschi et al. ............. 365/163 |
| 2010/0118595 A1 * | 5/2010 | Bae et al. ...................... 365/148 |
| 2011/0103140 A1 * | 5/2011 | Chung .......................... 365/163 |

* cited by examiner

*Primary Examiner* — Richard Elms
*Assistant Examiner* — Mohammed A Bashar
(74) *Attorney, Agent, or Firm* — Ming Chow; Sinorica, LLC

(57) ABSTRACT

A data readout circuit of phase change memory, relating to one or more phase change memory cells, wherein each phase change memory cell is connected to the control circuit by bit line and word line; said data readout circuit comprises: a clamp voltage generating circuit, used to generate a clamp voltage; a precharge circuit, used to fast charge bit line under the control of a clamp voltage; a clamped current generating circuit, used to generate a clamped current to keep bit line at clamped state under the control of a clamp voltage; a clamped current operation circuit, used to perform subtraction and multiplication on clamped current to increase the difference of clamped current between high resistance state and low resistance state; a sense amplifier circuit, used to compare the operated clamped current and the reference current and output the readout result. Compared with the prior art, the data readout circuit of phase change memory provided by the present invention can effectively enhance the data readout speed, decrease the misreading window between high resistance state and low resistance state, reduce the crosstalk of data readout, and improve the reliability of data readout.

9 Claims, 3 Drawing Sheets

DATA READOUT CIRCUIT OF PHASE CHANGE MEMORY

FIELD OF THE INVENTION

The present invention relates to phase change memory, and more particularly to a data readout circuit of phase change memory.

BACKGROUND OF THE INVENTION

Phase change memory (also known as phase change random access memory, PC-RAM) is a novel variable resistance non-volatile semiconductor memory. Compared with various kinds of semiconductor memory technologies of the day, it has advantages of low power consumption, high density, anti-radiation, non-volatility, high-speed read, long cycle life ($>10^{13}$ times), device size scalability (nano-scale), high and low temperature resistance ($-55°$ C. to $125°$ C.), vibration proof, anti-electronic interference and simple process (compatible with current integrated circuit processes) and thus is universally regarded as the most competitive one of the next generation of memories in industry, enjoying extensive market prospect.

Phase change memory employs chalcogenide material as memory medium, utilizing the Joule heat generated by electric pulse or light pulse to realize reversible phase change of phase change memory material between amorphous (high resistance) state and crystalline (low resistance) state so as to realize data write and erase operations, while data read operation is realized by discerning the resistance states.

Data readout circuit is necessary to read the dada (i.e., crystalline or amorphous state) that are stored in phase change memory and directly represented as low resistance state or high resistance state, so phase change memory functions by inputting low-value current or voltage into the phase change memory cell and then measuring the corresponding voltage or current under the control of read enable signal and data readout circuit.

Generally, the data readout circuit works by sending a small current (voltage) value to the phase change memory cell, then the bit line voltage (current) is to be read out, and if the bit line voltage is high (current is low), then the phase change cell is at high resistance state, i.e. "1"; if the bit line voltage is low (current is high), then the phase change cell is at low resistance state, i.e. "0". During the read process, however, the current flowing through the phase change memory cell will cause the phase change memory cell to generate Joule heat, and if the Joule heat power is greater than the heat dissipation efficiency of phase change memory cell, the heat effect will affect the basic state of phase change memory cell; meanwhile, if the voltage difference between two terminals of the phase change memory cell is above certain threshold, internal carriers of phase change material will lead to breakdown effect with a surge of carriers, showing characteristics of low resistance state even though no phase change occurs at all. These two phenomena mentioned above are known as destructive readout phenomenon.

In order to avoid the above destructive readout phenomenon, data readout circuit shall meet the following requirements: readout current (voltage) shall be very small such that the power of generating Joule heat will not be over the heat dissipation efficiency of phase change memory cell; when selecting a properly high readout current (voltage) in a permitted range, it shall be ensured that the readout speed is too high for the Joule heat generated to lead to the basic state change of the cell, and that the maximum readout current (voltage) shall be lower than the breakdown threshold of internal carriers so as to avoid breakdown effect induced by internal carriers of phase change material.

The foregoing requirements can be met for phase change memory under ideal conditions. However, as to actual phase change memory, the presence of parasitic capacitor on bit line will meet the above requirements while, at the same time, incur more time for the operation of current (voltage) readout. Since data readout circuit can not properly read out the state of the phase change memory cell until the bit line capacitor is charged up by the readout current (voltage), the speed of phase change memory is greatly restricted.

Conventional mode of current readout (i.e., inputting a voltage to read the corresponding current) generally works in the way that the operation amplifier in negative feedback operation mode directly imposes the clamp voltage on the bit line where the phase change cell is situated, and then compares the clamp voltage and the reference voltage. However, due to the presence of parasitic capacitor on bit line and the limitation that the bit line voltage shall not be over the threshold voltage of phase change cell, the readout speed is significantly restricted. Meanwhile, if the resistance difference between the high resistance state and the low resistance state is low, the readout speed and the reliability of the readout data of said data readout circuit will be highly restricted.

Moreover, due to the influence of the parasitic capacitors on bit lines or at the terminals of readout circuit, the initial read status for the next time will be affected by the charge remaining on the terminals of the data readout circuit and on the bit lines during the process of continuous high-speed read, and thereby incurring data crosstalk.

Therefore, it is an urgent technical issue for those skilled in the art to improve the problems of time consuming data readout, low resolution between high and low resistance as well as potential crosstalk, and to promote the speed and data reliability of phase change memory.

SUMMARY OF THE INVENTION

An object of the present invention is to provide a data readout circuit of phase change memory so as to solve the problems of data readout circuit in the prior art, i.e., low readout speed, low reliability of readout data or high power consumption.

In order to solve the above problems and others, the present invention provides a data readout circuit of phase change memory, wherein said phase change memory comprises one or more phase change memory cells and each phase change memory cell is connected to the control circuit by bit line and word line; said data readout circuit comprises: a clamp voltage generating circuit, used to generate a clamp voltage; a precharge circuit, used to fast charge the bit line of said memory cells under the control of said clamp voltage; a clamped current generating circuit, used to generate a clamped current to keep said bit line at clamped state under the control of said clamp voltage; a clamped current operation circuit, used to perform subtraction and multiplication on said clamped current to increase the difference of clamped current between high resistance state and low resistance state; a sense amplifier circuit, used to compare the processed clamped current operated by said clamped current operation circuit with the reference current and output the readout result.

Optionally, said data readout circuit further comprises a transfer gate connected in series on said bit line, used to connect said precharge circuit and said clamped current generating circuit to said bit line through said transfer gate.

Optionally, said data readout circuit further comprises a discharge circuit, used to discharge the remaining charge from said bit line and from the load terminals of said data readout circuit after the sense amplifier circuit completes comparison amplification.

Optionally, said discharge circuit comprises a controlled first nMOS transistor connected between said precharge circuit and ground wire and a controlled second nMOS transistor connected between said bit line and ground wire.

Optionally, said clamp voltage generating circuit comprises a current source, a first nMOS transistor connected in the form of diode, and a second nMOS transistor connected in series to the first nMOS transistor, wherein the drain of the first nMOS transistor is connected to the current output terminal of said current source, the gate of the first nMOS transistor is connected to the gate of the second nMOS transistor, the source of the first nMOS transistor is connected to the drain of the second nMOS transistor, and the source of the second nMOS transistor is connected to the ground.

Optionally, said precharge circuit comprises a precharge switching transistor and a precharge clamp nMOS transistor connected in series to said precharge switching transistor.

Optionally, said clamped current generating circuit comprises a clamp nMOS transistor.

Optionally, said clamped current operation circuit comprises two current mirror configurations formed by four pMOS transistors, wherein the gate of the first pMOS transistor is connected to the gate of the second pMOS transistor with the gate of the first pMOS transistor connected to the drain of the first pMOS transistor, the drain of the first pMOS transistor is connected to a bias current source, the source of the first pMOS transistor is connected to a voltage source, the source of the second pMOS transistor is connected to a voltage source, and the drain of the second pMOS transistor is connected to said clamped current generating circuit; the gate of the third pMOS transistor is connected to the gate of the fourth pMOS transistor with the gate of the third pMOS transistor connected to the drain of the third pMOS transistor, the drain of the third pMOS transistor connected to said clamped current generating circuit, the source of the third pMOS transistor connected to a voltage source, the source of the fourth pMOS transistor is connected to a voltage source, and the drain of the fourth pMOS transistor outputs the operated current; the current mirror formed by the first pMOS transistor and the second pMOS transistor provides the bias current, the second pMOS transistor and the third pMOS transistor perform subtraction, and the third pMOS transistor and the fourth pMOS transistor perform multiplication.

Optionally, said clamped current generating circuit comprises a clamp nMOS transistor, and the drain of said clamp nMOS transistor is connected to the drain of the second pMOS transistor and the drain of the third pMOS transistor.

Optionally, said sense amplifier circuit comprises a current comparator, wherein the input terminal of said current comparator inputs said clamped current and said reference current respectively, and the output terminal of said current comparator outputs the comparison result of the two currents mentioned above.

The present invention provides a data readout circuit of phase change memory, utilizing the clamped current operation circuit thereof to perform subtraction and multiplication on the generated clamped current and thus increasing the difference of clamped current between high resistance state and low resistance state. Compared with the prior art, the power consumption is lower with the same current difference between high resistance state and low resistance state; and with the same power consumption, greater current difference can be generated so as to discern between the high resistance and low resistance states of phase change memory cell in a faster and more accurate way, decrease the misreading window between high resistance and low resistance states, and improve the speed and reliability of data readout.

In addition, the data readout circuit of phase change memory provided by the present invention further comprises a discharge circuit, used to effectively discharge the remaining charge so as to reduce and even to eliminate data crosstalk and increase the speed and reliability of data readout.

DETAILED DESCRIPTION OF THE EMBODIMENTS

The inventor of the present invention finds that due to the current readout mode employed by conventional data readout circuit of phase change memory, there are the problems such as the limitation of speed and reliability for data readout and the data crosstalk due to the presence of parasitic capacitors.

Therefore, in order to prevent the above defects from occurring, the inventor of the present invention improves the prior art by providing a novel data readout circuit, which can perform subtraction and multiplication on the generated clamped current and increase the current difference between the clamped currents in high resistance state and low resistance state, thereby decreasing the misreading window between high resistance state and low resistance state and improving the speed and reliability of data readout.

The data readout circuit of phase change memory provided by the present invention is further detailed below with reference to specific embodiment.

The present invention is further detailed below with reference to the drawings. The present invention provides preferred embodiment, but the embodiment described shall not be interpreted as a limitation. Reference drawings are schematics for the present invention, wherein the illustrations are only on a schematic basis and shall not be construed as a limitation of the scope of the present invention.

Figure 1:
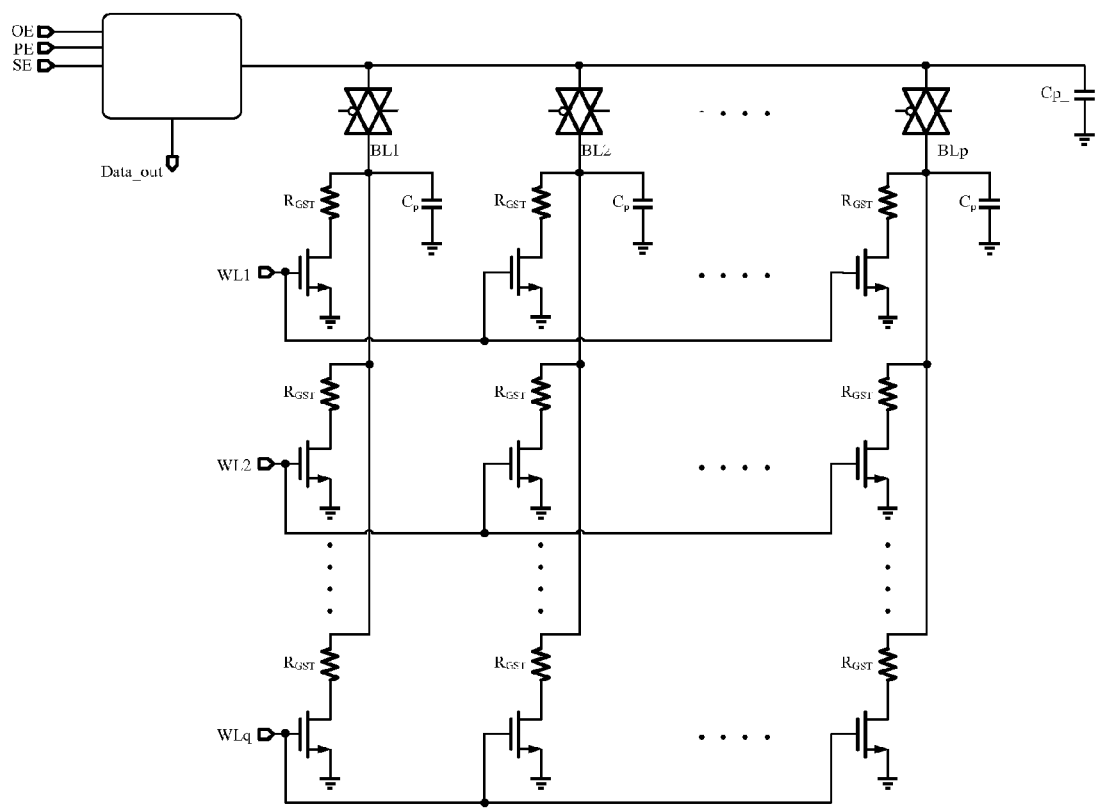
FIG. 1 is a structural schematic view of a data readout circuit load array of phase change memory.

FIG. 1 is a structural schematic view of a data readout circuit load array of phase change memory. As shown in FIG. 1, the load terminals of a data readout circuit are connect to a plurality of (e.g., p) bit lines through a plurality of transfer gates, while a plurality of (e.g., q) phase change memory cells are connected in parallel on each bit line. Moreover, a load terminal of the data readout circuit is connected with a parasitic capacitor $Cp\_$, while the load terminal of each transfer gate is connected with a parasitic capacitor $Cp$.

Figure 2:
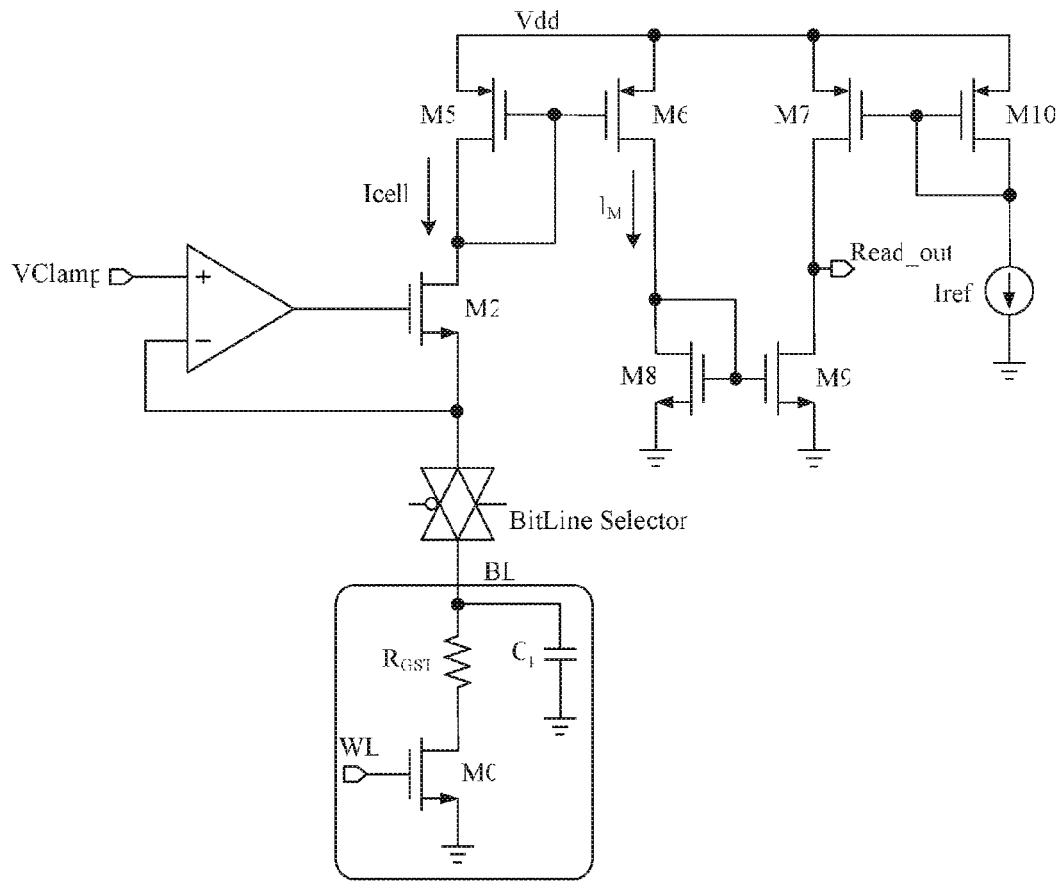
FIG. 2 is a structural schematic view of a data readout circuit of phase change memory of conventional current readout mode.

FIG. 2 is a structural schematic view of a data readout circuit of phase change memory of conventional current readout mode. As shown in FIG. 2, a data readout circuit is connected to the bit line of a memory cell through a transfer gate, wherein the data readout circuit comprises a negative feedback operation amplifier, a clamp nMOS transistor M2 that is connected with the operation amplifier and used to generate a clamped current, a clamped current operation circuit that is connected with the clamp nMOS transistor M2 and formed by two pMOS transistors M5 and M6, and a current comparator that is connected with said current operation circuit.

The data readout method utilizing the data readout circuit illustrated in FIG. 2 is as follow: a clamp voltage is imposed on the bit line by the operation amplifier connected in negative feedback, and the current comparator directly compare a clamped current $I_{cell}$ and a reference current $I_{ref}$ to output the comparison result.

As to the data readout circuit mentioned above, there might be possible that if the resistance difference between the high resistance state and low resistance state is small, the readout speed and the reliability of the readout data of said data readout circuit will be highly restricted; besides, due to the influence of the parasitic capacitors on bit lines or at the load terminals of readout circuit, the initial read status of the next time will be affected by the charge remaining on the terminals of the data readout circuit and on the bit lines during the process of continuous high-speed read, and thereby incurring data crosstalk.

Figure 3:
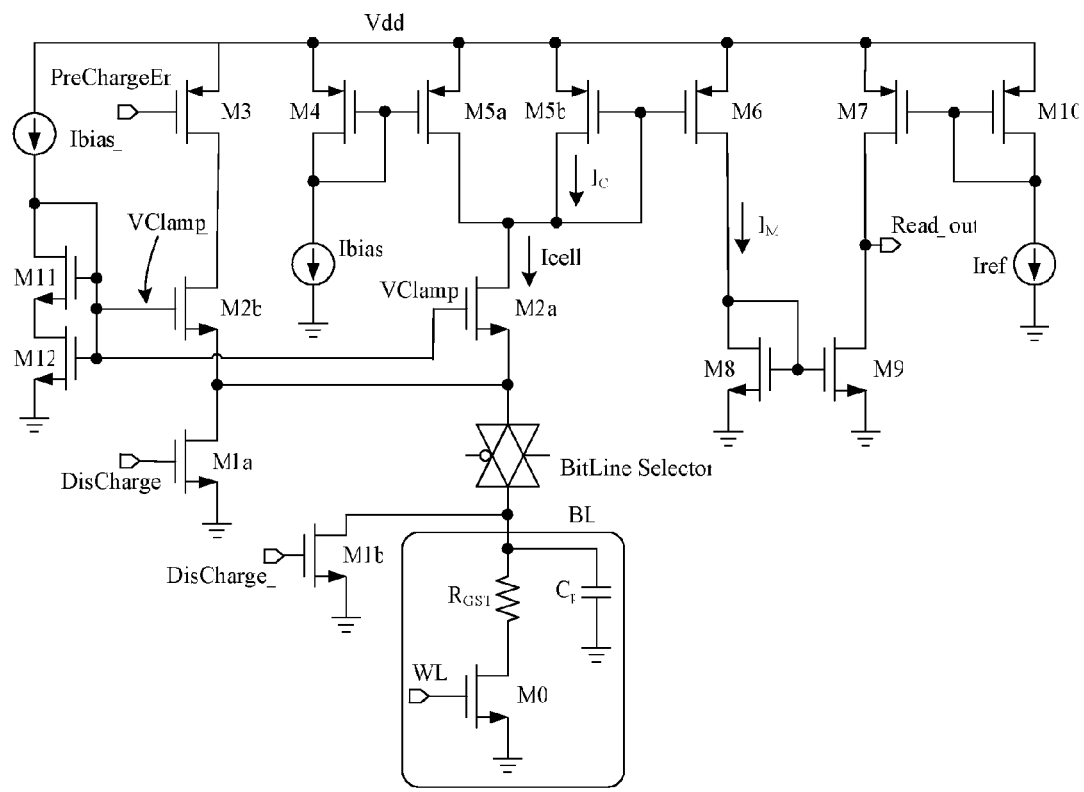
FIG. 3 is a structural schematic view of a data readout circuit of phase change memory provided by the present invention.

Therefore, the present invention provides a novel data readout circuit. FIG. 3 is a structural schematic view of a data readout circuit of phase change memory provided by the present invention. As shown in FIG. 3, the memory cell of phase change memory comprises bit line and word line, wherein said data readout circuit comprises a clamp voltage generating circuit, a precharge circuit, a clamped current generating circuit, a clamped current operation circuit, a sense amplifier circuit, a transfer gate and a discharge circuit.

A data readout circuit is connected to the bit line BL of memory cell through a transfer gate.

A clamp voltage generating circuit, used to generate the clamp voltage. In this embodiment, said clamp voltage generating circuit comprises a current source $I_{bias}$, a nMOS transistor M11 connected in the form of a diode and a nMOS transistor M12 connected in series to the nMOS transistor M11, wherein the drain of the nMOS transistor M11 is connected to the current output terminal of the current source $I_{bias}$, the gate of the nMOS transistor M11 is connected to the gate of the nMOS transistor M12, the source of the nMOS transistor M11 is connected to the drain of the nMOS transistor M12, and the source of the nMOS transistor M12 is connected to the ground.

A precharge circuit, used to fast charge the bit line under the control of a clamp voltage. In this embodiment, said precharge circuit comprises a precharge switching transistor M3 and a precharge clamp nMOS transistor M2b connected in series to said precharge switching transistor M3. The precharge switching transistor M3 is actually a pMOS transistor, wherein the gate of the pMOS transistor M3 is connected to the precharge enable signal, the source of the pMOS transistor M3 is connected to a voltage source Vdd, the drain of the pMOS transistor M3 is connected to the drain of the precharge clamp nMOS transistor M2b, wherein the gate of the precharge clamp nMOS transistor M2b is connected to the gate of the nMOS transistor M11 and the gate of the nMOS transistor M12 (to receive the clamp voltage), and the source of the precharge clamp nMOS transistor M2b is connected to a transfer gate.

A clamped current generating circuit, used to generate a clamped current to keep the bit line at the clamped state under the control of a clamp voltage. In this embodiment, said clamped current generating circuit comprises a clamp nMOS transistor M2a, wherein the gate of the clamp nMOS transistor M2a is connected to the gate of the nMOS transistor M11 and the gate of the nMOS transistor M12 (to receive the clamp voltage), the source of the clamp nMOS transistor M2a is connected to the source of the precharge clamp nMOS transistor M2b, and the drain of the clamp nMOS transistor M2a outputs a clamped current.

A clamped current operation circuit, comprising two current minor configurations formed by four pMOS transistors, wherein a pMOS transistor M4 and a pMOS transistor M5a form one current mirror configuration and a pMOS transistor M5b and a pMOS transistor M6 form the other current minor configuration. More specifically, the gate of the pMOS transistor M4 is connected to the gate of the pMOS transistor M5a with the gate of the pMOS transistor M4 connected to the drain of the pMOS transistor M4, the drain of the pMOS transistor M4 is connected to the bias current source $I_{bias}$, the source of the pMOS transistor M4 is connected to the voltage source Vdd, the source of the pMOS transistor M5a is connected to the voltage source Vdd, the drain of the pMOS transistor M5a is connected to the drain of the clamp nMOS transistor M2a in said clamped current generating circuit; the gate of the pMOS transistor M5b is connected to the gate of the pMOS transistor M6 with the gate of the pMOS transistor M5b connected to the drain of the pMOS transistor M5b, the drain of the pMOS transistor M5b is connected to the drain of the clamp nMOS transistor M2a in said clamped current generating circuit, the source of the pMOS transistor M5b is connected to the voltage source Vdd, the source of the pMOS transistor M6 is connected to the voltage source Vdd, and the drain of the pMOS transistor M6 outputs the operated current. By use of said clamped current operation circuit, subtraction and multiplication can be performed on the clamped current, wherein the current mirror formed by the pMOS transistor M4 and the pMOS transistor M5a provide the bias current, the pMOS transistor M5a and the pMOS transistor M5b perform subtraction, and the pMOS transistor M5b and the pMOS transistor M6 perform multiplication.

A sense amplifier circuit, used to compare a clamped current operated by said clamped current operation circuit and a reference current and then output the readout result. In this embodiment, said sense amplifier circuit is a current comparator, comprising a current mirror configuration formed by a nMOS transistor M8 and a nMOS transistor M9 as well as a current mirror configuration formed by a pMOS transistor M7 and a pMOS transistor M10. The gate of the nMOS transistor M8 is connected to the gate of the nMOS transistor M9 with the gate of the nMOS transistor M8 connected to the drain of the gate of the nMOS transistor M8 and the drain of the pMOS transistor M6 (to receive the operated clamped current), the source of the nMOS transistor M8 is connected to the ground, the source of the nMOS transistor M9 is connected to the ground, the drain of the nMOS transistor M9 is connected to the drain of the pMOS transistor M7 (to serve as the output terminal to output the readout result), the source of the pMOS transistor M7 is connected to the voltage source Vdd, the gate of the pMOS transistor M7 is connected to the gate of the pMOS transistor M10, the gate of the pMOS transistor M10 is connected to the drain of the pMOS transistor M10 (to receive the reference current), and the source of the pMOS transistor M10 is connected to the voltage source Vdd.

A further discharge circuit, used to discharge the remaining charge from said bit line and from load terminals of said data readout circuit after said sense amplifier circuit completes comparison amplification. In this embodiment, said discharge circuit comprises a controlled nMOS transistor M1a connected between said precharge circuit and ground wire and a controlled nMOS transistor M1b connected between said bit line and ground wire. The gate of the controlled nMOS transistor M1a is connected to a discharge voltage, the source of the controlled nMOS transistor M1a is connected to the ground, the drain of the controlled nMOS transistor M1a is connected to the source of the precharge clamp nMOS transistor M2b in said precharge circuit and one terminal of the transfer gate; the gate of the controlled nMOS transistor M1b is connected to a discharge voltage, the source of the controlled nMOS transistor M1b is connected to the ground, the drain of the controlled nMOS transistor M1b is connected to said bit line and the other terminal of the transfer gate. Preferably, the control signal of the nMOS transistor M1a in the discharge circuit is valid when the chip-selected read signal is invalid, and is active upon the completion of each read operation; the control signal of the nMOS transistor M1b in the discharge circuit is valid upon the completion of each read operation.

When the data readout circuit of the present invention is put into use, the clamp voltage generating circuit generates a clamp voltage; the clamp voltage is applied on the clamp nMOS transistor M2a in the clamped current generating circuit to control the bit line voltage and generate a clamped current $I_{Cell}$; the clamped current operation circuit performs the following operation on the clamped current $I_{Cell}$: $I_C=I_{Cell}-m\ I_{bias}$, $I_M=n\ I_C$; the current comparator compares the operated clamped current $I_{Cell}$ and the reference current $I_{ref}$ to output the readout result. Here, it's assumed that the clamped bit line voltage is 0.2 V, the resistance of the phase change memory cell in low resistance state is 50 KΩ, and the resistance of the phase change memory cell in high resistance state is 100 KΩ, then, accordingly, the clamped currents would be $I_{Cell\_Low}=0.2V/50\ KΩ=4\ μA$ and $I_{Cell\_High}=0.2V/100\ KΩ=2\ μA$, respectively. As to the data readout circuit in conventional current readout mode, the current difference between the low resistance state and high resistance state would be $\Delta I_{Cell}=|I_{Cell\_Low}-I_{Cell\_High}|=|4\ μA-2\ μA|=2\ μA$; as to the data readout circuit provided by the present invention, a clamped current operation circuit thereof is utilized to perform subtraction and multiplication on the generated current, where m=2, n=2, and if $I_{bias}=1\ μA$, then, in low resistance state, $I_{Cell\_Low}=0.2V/50\ KΩ=4\ μA$, $I_{C\_Low}=|I_{Cell\_Low}-m\ I_{bias}|=|4\ μA-2×1\ μA|=2\ μA$, $I_{M\_Low}=n\ I_{C\_Low}=2×2\ μA=4\ μA$; in high resistance state, $I_{Cell\_High}=0.2V/100\ KΩ=2\ μA$, $I_{C\_High}=|I_{Cell\_High}-m\ I_{bias}|=|2\ μA-2×1\ μA|=0\ μA$ $I_{M\_High}=n\ I_{C\_High}=2×0\ μA=0\ μA$; the current difference between the low resistance state and high resistance state would be $\Delta I_M=|I_{M\_Low}-I_{M\_High}|=|4\ μA-0\ μA|=4\ μA$. In the present invention, if the current difference between the low resistance state and high resistance states is $\Delta I_M=4\ μA$, the total current consumed by said data readout circuit would be $I_{Total}=I_{bias}+I_{Cell\_Low}+I_{M\_Low}=1\ μA+4\ μA+4\ μA=9\ μA$ in low resistance state, while the total current consumed by said data readout circuit would be $I_{Total}=I_{bias}+I_{Cell\_High}+I_{M\_High}=1\ μA+2\ μA+0\ μA=3\ μA$ in high resistance state. In contrast, if the data readout circuit of the prior art is used with the current difference between the low resistance state and high resistance state kept as $\Delta I_M=4\ μA$, the total current consumed by said data readout circuit would be $I_{Total}=I_{Cell\_Low}+I_{M\_Low}=4\ μA+8\ μA=12\ μA$ in low resistance state, while the total current consumed by said data readout circuit would be $I_{Total}=I_{Cell\_High}+I_{M\_High}=2\ μA+4\ μA=6\ μA$. Therefore, with the same current difference between the high resistance state and the low resistance state, the current readout mode of the present invention functions with less power consumption than conventional current readout mode; and with the same power consumption, the current readout mode of the present invention can generate greater current difference than conventional current readout mode and thus discern between the high resistance state and low resistance state of phase change memory cell in a faster and more accurate way to increase the reliability of data readout.

Meanwhile, as shown in FIG. 3, the data readout circuit of the present invention further comprises a clamp voltage generating circuit. Said clamp voltage generating circuit can automatically regulate the clamp voltage according to process variation and thus compensate the error of $V_{th}$ ($V_{th}$ is the threshold voltage of the MOS transistor) of the clamp transistor caused by process variation and enable the bit line voltage to be kept at a preset clamp voltage value during the readout process.

Furthermore, in the present invention, the discharge circuit can be used to discharge the remaining charge from said bit lines and from the load terminals of said data readout circuit after said sense amplifier circuit completes comparison amplification; therefore reducing and even eliminating data crosstalk and increasing the speed and reliability of data readout.

Figure 4:
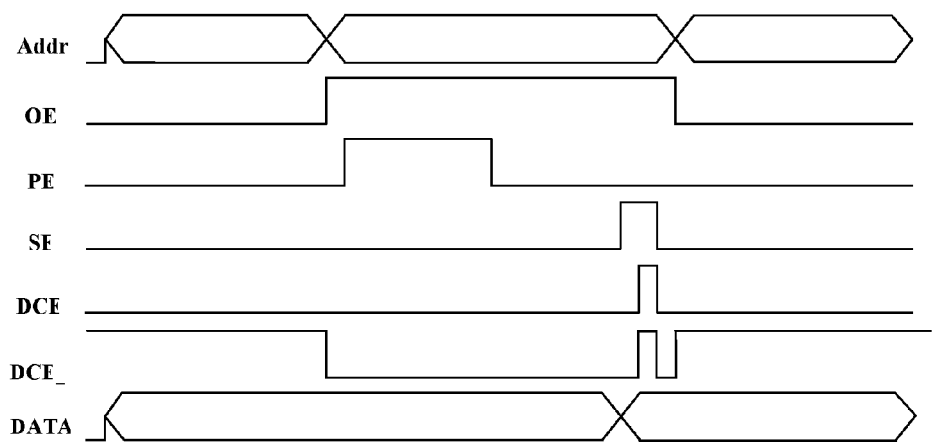
FIG. 4 is a timing diagram for a read operation of a data readout circuit of phase change memory provided by the present invention.

FIG. 4 is a timing diagram for a read operation of a data readout circuit of phase change memory provided by the present invention. As shown in FIG. 4, Addr is the address signal of phase change memory cell, OE is the read enable signal, PE is the precharge enable signal, SE is the data latch signal, DCE and DCE_are discharge enable signals of the discharge circuit on the data readout circuit load terminal and of the discharge circuit on bit line respectively (i.e., Discharge signal and Discharge_signal in FIG. 3), DATA is the valid readout data, wherein OE, PE, SE, DCE and DCE_are all valid at high level. In addition, DCE_signal is also controlled by write enable signal when the read enable signal OE is invalid, that is to say, when a write operation is performed on the corresponding phase change memory cell, the DCE_value is at low level or is controlled by other control methods required in write operation; the present invention only discusses the operation method of read operation, so only the timing within the read operation cycle is specified herein.

To sum up, the data readout circuit of phase change memory provided by the present invention can effectively enhance the read speed, decrease the misreading window between high resistance state and low resistance state, reduce the crosstalk of data readout, and improve the reliability of data readout.

The description of foregoing embodiment is only an illustrative description of the principle and function of the present invention but is not a limitation of the present invention. It is apparent to those skilled in the art that modifications can be made to the foregoing embodiment without deviating from the spirit and scope of the present invention. Accordingly, the protection scope of the present invention shall be as described in the claims.

What is claimed is:

1. A data readout circuit of phase change memory, wherein said phase change memory comprises one or more phase change memory cells and each phase change memory cell is connected to the control circuit by bit line and word line; characterized in that said data readout circuit comprises:
   a clamp voltage generating circuit, used to generate a clamp voltage;
   a precharge circuit, used to fast charge bit line of said memory cells under the control of said clamp voltage;
   a clamped current generating circuit, used to generate a clamped current to keep said bit line at clamped state under the control of said clamp voltage;

a clamped current operation circuit, used to perform subtraction and multiplication on said clamped current to increase the difference of clamped current between high resistance state and low resistance state;

a sense amplifier circuit, used to compare the clamped current operated by said clamped current operation circuit and a reference current and output a readout result;

said clamp voltage generating circuit comprises a current source, a first nMOS transistor connected in the form of a diode, and a second nMOS transistor connected in series to the first nMOS transistor, wherein the drain of the first nMOS transistor is connected to the current output terminal of said current source, the gate of the first nMOS transistor is connected to the gate of the second nMOS transistor, the source of the first nMOS transistor is connected to the drain of the second nMOS transistor, and the source of the second nMOS transistor is connected to the ground.

2. The data readout circuit of phase change memory according to claim 1, characterized by further comprising a transfer gate connected in series on said bit line, used to connect said precharge circuit and said clamped current generating circuit to said bit line through said transfer gate.

3. The data readout circuit of phase change memory according to claim 1, characterized by further comprising a discharge circuit, used to discharge the remaining charge from said bit line and from load terminal of said data readout circuit after said sense amplifier circuit completes comparison amplification.

4. The data readout circuit of phase change memory according to claim 3, characterized in that said discharge circuit comprises a controlled first nMOS transistor connected between said precharge circuit and ground wire and a controlled second nMOS transistor connected between said bit line and ground wire.

5. The data readout circuit of phase change memory according to claim 1, characterized in that said precharge circuit comprises a precharge switching transistor and a precharge clamp nMOS transistor connected in series to said precharge switching transistor.

6. The data readout circuit of phase change memory according to claim 1, characterized in that said clamped current generating circuit comprises a clamp nMOS transistor.

7. The data readout circuit of phase change memory according to claim 1, characterized in that said clamped current operation circuit comprises two current mirror configurations formed by four pMOS transistors, wherein the gate of the first pMOS transistor is connected to the gate of the second pMOS transistor with the gate of the first pMOS transistor connected to the drain of the first pMOS transistor, the drain of the first pMOS transistor is connected to the bias current source, the source of the first pMOS transistor is connected to a voltage source, the source of the second pMOS transistor is connected to a voltage source, and the drain of the second pMOS transistor is connected to said clamped current generating circuit; the gate of the third pMOS transistor is connected to the gate of the fourth pMOS transistor with the gate of the third pMOS transistor connected to the drain of the third pMOS transistor, the drain of the third pMOS transistor connected to said clamped current generating circuit, the source of the third pMOS transistor connected to a voltage source, the source of the fourth pMOS transistor is connected to a voltage source, and the drain of the fourth pMOS transistor outputs the operated current; the current mirror formed by first pMOS transistor and the second pMOS transistor provides a bias current, the second pMOS transistor and the third pMOS transistor perform subtraction, and the third pMOS transistor and the fourth pMOS transistor perform multiplication.

8. The data readout circuit of phase change memory according to claim 7, characterized in that said clamped current generating circuit comprises a clamp nMOS transistor, and the drain of said clamp nMOS transistor is connected to the drain of the second pMOS transistor and the drain of the third pMOS transistor.

9. The data readout circuit of phase change memory according to claim 1, characterized in that said sense amplifier circuit comprises a current comparator, wherein an input terminal of said current comparator inputs said clamped current and said reference current respectively, and an output terminal of said current comparator outputs a comparison result of the two currents mentioned above.

* * * * *